United States Patent
deVilliers

(10) Patent No.: US 9,646,845 B2
(45) Date of Patent: May 9, 2017

(54) METHOD OF FORMING A MASK FOR SUBSTRATE PATTERNING

(71) Applicant: Tokyo Electron Limited, Minato-ku, Tokyo (JP)

(72) Inventor: Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/973,284

(22) Filed: Dec. 17, 2015

(65) Prior Publication Data

US 2016/0181115 A1    Jun. 23, 2016

Related U.S. Application Data

(60) Provisional application No. 62/094,602, filed on Dec. 19, 2014.

(51) Int. Cl.
*H01L 21/308* (2006.01)
*H01L 21/311* (2006.01)
(Continued)

(52) U.S. Cl.
CPC ........ *H01L 21/3088* (2013.01); *G03F 7/0035* (2013.01); *G03F 7/38* (2013.01);
(Continued)

(58) Field of Classification Search
None
See application file for complete search history.

(56) References Cited

U.S. PATENT DOCUMENTS

2009/0275207 A1\* 11/2009 Honda .............. H01J 37/32027
                                                                438/729
2010/0243161 A1     9/2010 Tran
(Continued)

FOREIGN PATENT DOCUMENTS

JP        2010-527138        8/2010

OTHER PUBLICATIONS

International Patent Application No. PCT/US2015/066448, "International Search Report and Written Opinion," mailed Apr. 12, 2016, International Filing Date Dec. 17, 2015.
(Continued)

*Primary Examiner* — Jiong-Ping Lu

(57) ABSTRACT

Techniques herein include using acid-diffusion—controllable to specific diffusion lengths—to create sacrificial structures that, when removed, define a critical dimension (CD) of various features and contact openings. Removing such sacrificial structures defines a trench of a precisely controllable width. The surrounding material is then neutralized from additional solubility shifts using a ballistic electron treatment, thereby creating a first mask layer. A second mask layer formed on top of the first mask layer can be lithographically exposed and developed. The combined mask layers define a pattern for transfer into an underlying target layer. Accordingly, techniques disclosed herein enable patterning of features and contact openings having widths in a range from less than about 1 nanometer and up to around 50 nanometers or more. Techniques herein can also enable use of high-speed EUV (extreme ultraviolet) patterning.

18 Claims, 7 Drawing Sheets

(51) Int. Cl.
   *H01L 21/3213* (2006.01)
   *H01L 21/027* (2006.01)
   *H01L 21/033* (2006.01)
   *G03F 7/38* (2006.01)
   *G03F 7/00* (2006.01)
   *H01L 21/3105* (2006.01)

(52) U.S. Cl.
   CPC ........ *H01L 21/027* (2013.01); *H01L 21/0273* (2013.01); *H01L 21/0337* (2013.01); *H01L 21/0338* (2013.01); *H01L 21/3081* (2013.01); *H01L 21/3085* (2013.01); *H01L 21/3086* (2013.01); *H01L 21/31058* (2013.01); *H01L 21/31116* (2013.01); *H01L 21/31144* (2013.01); *H01L 21/32139* (2013.01)

(56) References Cited

U.S. PATENT DOCUMENTS

| | | | |
|---|---|---|---|
| 2011/0014790 A1* | 1/2011 | Kim | H01L 21/0273 438/689 |
| 2012/0043646 A1 | 2/2012 | Kim | |
| 2013/0309871 A1* | 11/2013 | DeVilliers | H01L 21/0273 438/703 |

OTHER PUBLICATIONS

U.S. Appl. No. 61/912,015, "Direct Current Superposition Freeze," filed Dec. 5, 2013.

* cited by examiner

METHOD OF FORMING A MASK FOR SUBSTRATE PATTERNING

CROSS REFERENCE TO RELATED APPLICATIONS

The present application claims the benefit of U.S. Provisional Patent Application No. 62/094,602, filed on Dec. 19, 2014, entitled "Method of Forming a Mask for Substrate Patterning," which is incorporated herein by reference in its entirety.

BACKGROUND OF THE INVENTION

This invention relates to microfabrication including microfabrication of integrated circuits as well as processes involved in patterning semiconductor substrates.

In material processing methodologies (such as photolithography), creating patterned layers typically involves the application of a thin layer of radiation-sensitive material, such as photoresist, to an upper surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system. This exposure creates a latent pattern within the radiation-sensitive material which can then be developed. Developing refers to dissolving and removing a portion of the radiation-sensitive material to yield a topographic or physical pattern. For example, developing can include removal of irradiated regions of the radiation-sensitive material (as in the case of positive photoresist), or non-irradiated regions (as in the case of negative resist) using a developing solvent. The topographic pattern can then function as a mask layer.

Preparation and development of various films used for patterning can include thermal treatment or baking. For example, a newly applied film can require a post-application bake (PAB) to evaporate solvents and/or to increase structural rigidity or etch resistance. Also, a post-exposure bake (PEB) can be executed to set a given critical dimension (CD) in a particular pattern. A PEB functions by affecting acid diffusion profiles. Post-exposure bakes can be beneficial to smooth lines and mitigate standing wave profiles. Another type of bake is a cross-linking bake which can be executed if cross-linkers (cross-linking agents) are include in a photoresist composition. Cross-linkers include agents or materials that, upon thermal activation promote cross-linking between polymers. Cross-linking a resist is one technique to protect a resist from being dissolved. Use of cross-linkers, however, can have the effect of a filler and displace other desirable resist components such as photo acid generators, photo destructive bases, and other photoactive components. Fabrication tools for coating and developing substrates typically include one or more baking modules. Some lithography processes include coating a wafer with a thin film of Bottom Anti-reflective Coating (BARC), followed by coating with a resist, and then exposing the wafer to a pattern of light as a process step for creating microchips. BARC is a thin film that is typically placed between the substrate and the resist layer to absorb remaining light rays during an exposure. This is to prevent rough edges created by reflected light rays during exposure. BARC is also used between multiple layer exposures to protect the previously created layers from being exposed again.

SUMMARY

Conventional lithographic techniques for exposing a pattern of actinic radiation onto a substrate have various challenges that limit a size of features exposed, and limit pitch or spacing between exposed features. Because of the limited resolution that is feasible using optical photolithographic exposure, various approaches have been introduced to pattern films beyond the resolution of what exposure tools can reliably provide. These techniques are known as double patterning, pitch multiplication (pitch density multiplication to be accurate), or sub-resolution patterning. These approaches can allow patterning of smaller features at a smaller pitch than what is currently possible with conventional lithographic techniques. There are various double patterning approaches, for example, Litho/Etch/Litho/Etch (LELE), Litho/Litho/Etch (LLE), Litho/Freeze/Litho/Etch (LFLE) have been used. These patterning approaches reduce feature size, but still have challenges.

One challenge with fabricating smaller feature sizes is to pattern very small contact openings including slot-shaped or elongated openings for subsequent metallization. For example, current design efforts specify having slot contacts with widths less than about 10-30 nanometers. Conventional exposure techniques alone, however, can only reliably pattern openings down to about 50-60 nanometers in width. Techniques disclosed herein, however, enable patterning of features and contact openings having widths less than about 1 nanometer. Of course, widths in the 1-50 nanometer range can also be realized with these techniques. Techniques herein include using acid-diffusion—controllable to specific diffusion lengths—to create sacrificial structures that, when removed, define a critical dimension (CD) of various features and contact openings. Removing such sacrificial structures defines a trench of a precisely controllable width. The surrounding material is then protected from additional solubility shifts using a ballistic electron treatment. The result is a first mask layer. A second mask layer is formed on top of the first mask layer, exposed to patterned light, and then developed. The combined mask layers elevationally define a pattern for transfer into an underlying target layer or substrate. As such, CDs can be defined by diffusion lengths of acid treatments instead of being based on photolithographic resolution limitations.

One embodiment includes a method for forming a pattern on a substrate. This method includes forming mandrels comprising mandrel material on a target layer of a substrate. The mandrels define spaces between adjacent mandrels. A filler material is deposited into the defined spaces. Sacrificial structures are formed along an interface between the mandrels and the filler material. The sacrificial structures are removed resulting in a first mask. The first mask includes mask features comprising both the mandrel material and the filler material. Such sacrificial structures can be referred to as "anti-spacers" in the context of this document. The mask features are treated with a flux of electrons by coupling negative polarity direct current power to a top electrode of a plasma processing system. The flux of electrons is accelerated from the top electrode with sufficient energy to pass through plasma and strike the mask features. The first mask is covered with a layer of radiation-sensitive material. An exposure pattern is developed in the layer of radiation-sensitive material. The exposure pattern was created via photolithography. Developing the exposure pattern results in a second mask that reveals (uncovers) portions of the first mask. The first mask and the second mask together define a combined pattern. The combined pattern can then be transferred into one or more underlying layers.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein include using acid-diffusion—controllable to specific diffusion lengths—to create sacrificial structures that, when removed, define a critical dimension (CD) of various features and contact openings. Removing such sacrificial structures defines a trench of a precisely controllable width. The surrounding material is then protected from additional solubility shifts using a ballistic electron treatment, thereby creating a first mask layer. This ballistic electron treatment can essentially, for example, neutralize a patterned photoresist layer preventing any additional solubility changes or photo reactivity. A second mask layer is formed on top of the first mask layer, lithographically exposed, and then developed. The combined mask layers elevationally define a pattern for transfer into an underlying target layer or substrate. In other words, two patterns can elevationally cross each other. As such, CDs can be defined by diffusion lengths of acid treatments instead of by photolithographic resolution. Accordingly, techniques disclosed herein enable patterning of features and contact openings having widths in a range from less than about 1 nanometer and up to around 50 nanometers or more. Techniques herein can also enable use of high-speed EUV (extreme ultraviolet) patterning.

Figure 1:
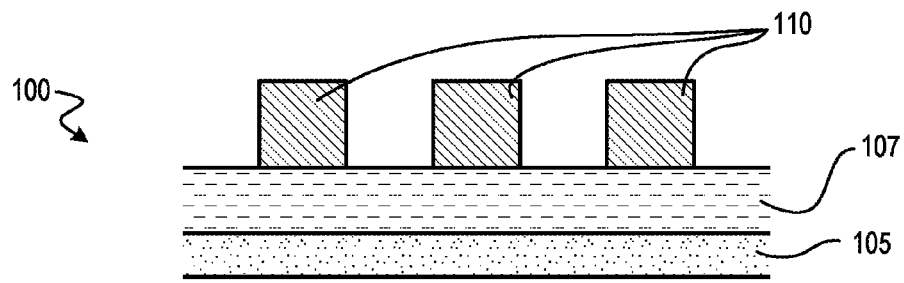
FIGS. 1-13 are schematic, cross-sectional views of a substrate segment showing a process sequence for patterning a substrate.

Techniques herein include various methods for forming a pattern on a substrate. Referring now to FIG. 1, a schematic, cross-sectional view of an example segment of substrate 100 is shown. One embodiment comprises forming mandrels 110 comprising mandrel material on a target layer 107 of a substrate 100. Target layer 107 can be positioned on one or more underlying layers 105. The mandrels 110 define spaces between adjacent mandrels. The mandrels 110 can be formed using any fabrication process to define structures such as photolithography, double patterning, sidewall image transfer, etc. Mandrel material can be selected from various materials such as hardmask materials, soft mask materials, and photoresist compositions. In one embodiment, the mandrels 110 are comprised of a second radiation-sensitive material. The mandrels 110 essentially define a relief pattern layer on the substrate 100. The mandrel material can be selected as a second radiation-sensitive material, because patterning using photoresist materials is a common patterning technique. Accordingly, mandrels can be formed by developing a latent pattern in the second radiation-sensitive material, with the latent pattern being formed by photolithographic exposure. In some embodiments, the mandrels can be formed using a high-speed EUV resist. The high-speed EUV resist is patterned, and then the pattern can be reversed to create the mandrels.

After mandrels are formed, sacrificial structures are formed along an interface between the mandrels 110 and filler material (shown in subsequent figures). Filler material 130 is shown having been deposited on substrate 100 in FIG. 6. Note that techniques herein include several alternative flow sequences and the sacrificial structures can be formed before or after deposition of the filler material 130.

Figure 2:
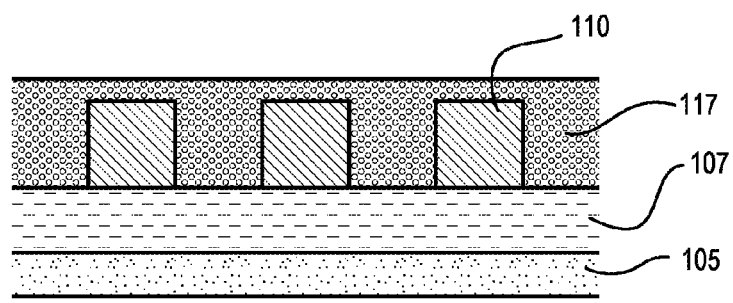
Figure 3:
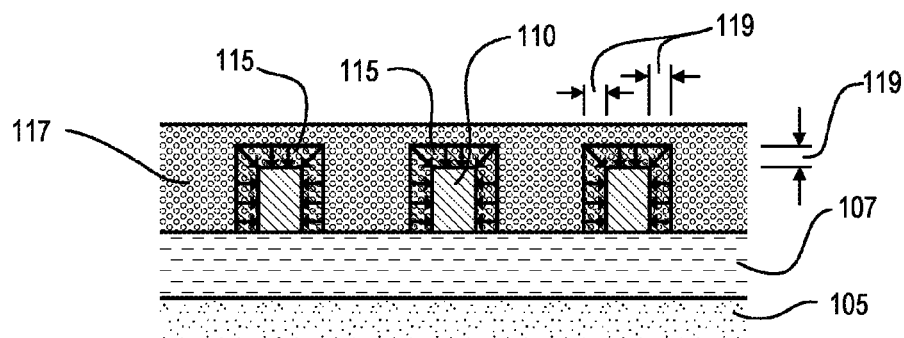

In one alternative embodiment, forming sacrificial structures comprises chemically altering portions of the of mandrels 110 at interfaces with the filler material. Removing the sacrificial structures can comprise removing the chemically altered portions of the mandrel material. Chemically altering portions of the mandrel material can include changing a solubility of portions of the mandrel material such that the sacrificial structures 115 are comprised of mandrel material. Chemically altering portions can include diffusing a chemically active species into the portions. Referring now to FIG. 2, forming the sacrificial structures can include depositing the chemically active species 117 on the mandrels 110 after forming the mandrels and prior to depositing the filler material 130. The substrate 100 can then be subjected to a bake process that activates diffusion of the chemically active species into the portions of the mandrel material. The gate process can reach a temperature and have a duration specific to a particular chemically active species and/or result in a specific diffusion length into the mandrels 110. Thus, subjecting the substrate to a bake process activates diffusion of the chemically active species into the portions. FIG. 3 shows chemically active species 117 diffusing into mandrels 110. Diffusing chemically-active species (such as an acid or photo acid) into the mandrel material or into the filler material includes controlling heating of the substrate to result in a predetermined diffusion distance 119 into the mandrel material or into the filler material.

Figure 4:
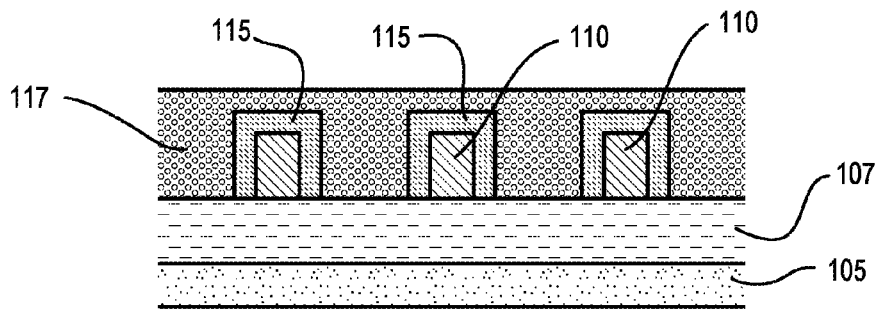
Figure 5:
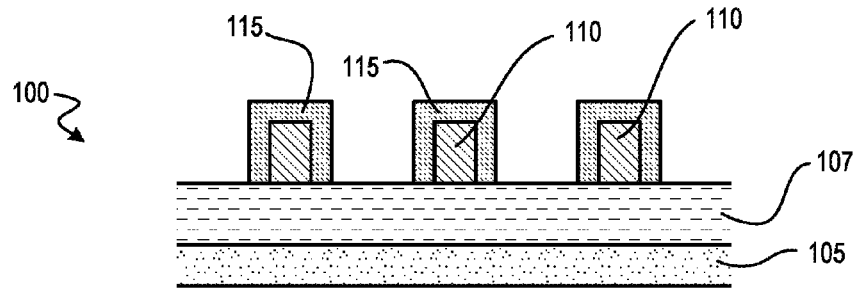

In embodiments in which the mandrel material is chemically altered, an acid can be coated on top of the mandrels 110 and then diffused into the mandrel material thereby creating sacrificial structures 115 as shown in FIG. 4. After completion of diffusion of chemically active species 117 of the predetermined diffusion distance 119 into mandrels 110, the chemically active species 117 can be removed from substrate 100 as shown in FIG. 5. The result is that mandrels 110 have essentially shrunk in size because an exterior portion of the mandrels 110 have been chemically altered such that they are now soluble in a particular developer, and now comprise the sacrificial structures 115.

Figure 6:
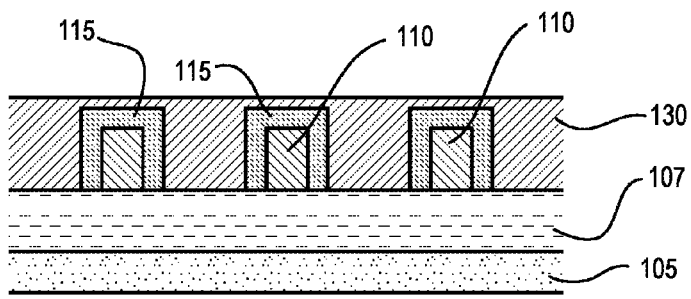
Figure 7:
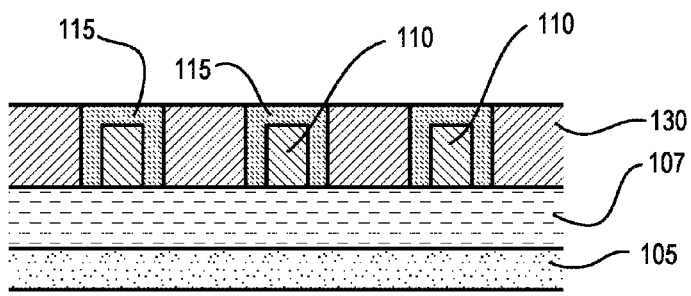

In FIG. 6, a filler material 130 is deposited into the defined spaces. Note that filler material 130 fills spaces defined by mandrels 110, such as in between adjacent mandrels. In one embodiment, the filler material can be a third radiation-sensitive material, such as a photoresist. Various photoresists can be deposited by spin-on deposition, which is relatively quick and economical. Note that filler material 130 does not need to cover mandrels 110 and sacrificial structures 115, but in practice (such as with spin-on deposition) there will typically be some filler material 130 that covers existing structures when deposited. This topcoat material can be removed down to the sacrificial structures 115 using various techniques such as top-down acid diffusion, controlled etching, controlled ashing, and using a relatively diluted developer, etc. FIG. 7 shows a result of substrate 100 after removing any topcoat material. Note that in FIG. 7, from a top-down perspective, there is an alternating pattern of filler material 130 and sacrificial structures 115.

Figure 8:
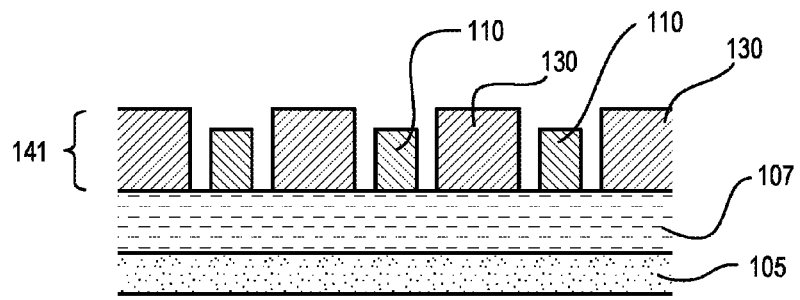

Methods herein comprise removing the sacrificial structures 115 resulting in a first mask 141 comprising mask features formed of the mandrel material 110 and the filler material 130, as shown in FIG. 8. Removing the sacrificial structures 115 can include executing a developer cleaning process that dissolves the chemically altered portions using a developer and clears the dissolved material from the substrate 100. The chemically altered portions being more soluble to a developer as compared to unaltered portions of the mandrels. The top portion of the filler material 130 is chemically altered to become soluble, then a particular developer can simultaneously remove the top portion of the filler material 130 and the sacrificial structures 115. In other embodiments, the top portion of the filler material can be removed prior to removing the sacrificial structures 115.

The mask features of the first mask 141 can then be treated with a flux of electrons 161 by coupling negative polarity direct current power to a top electrode 163 of the plasma processing system. The flux of electrons is accelerated from a top electrode with sufficient energy to pass through a plasma 165 and strike the substrate, or rather, to strike the mask features. The top electrode 163 can be comprised of silicon. Coupling negative polarity direct current can cause sputtering of silicon onto the first mask 141 creating a conformal layer of silicon on the first mask 141. Subsequently exposing the conformal layer of silicon to an oxygen-containing environment causes the conformal layer of silicon to become silicon oxide. Treating the mask features to the flux of electrons increases a resistance of the mask features to developer chemicals. Depending on particular materials being used, the flux of electrons can cause cross-linking of photoresist material, which can eliminate any potential for solubility shifts. By way of a non-limiting example, when mandrels 110 and filler material 130 are both comprised of photoresist, such cross-linking and silicon oxide protection can eliminate radiation sensitivity of these particular materials as well as eliminate the potential for solubility changes. More details on treating polymer materials with a flux of electrons can be found in U.S. patent application 61/912,015, filed on Dec. 5, 2013, entitled "Direct Current Superposition Freeze," which is hereby incorporated by reference in its entirety.

Figure 10:
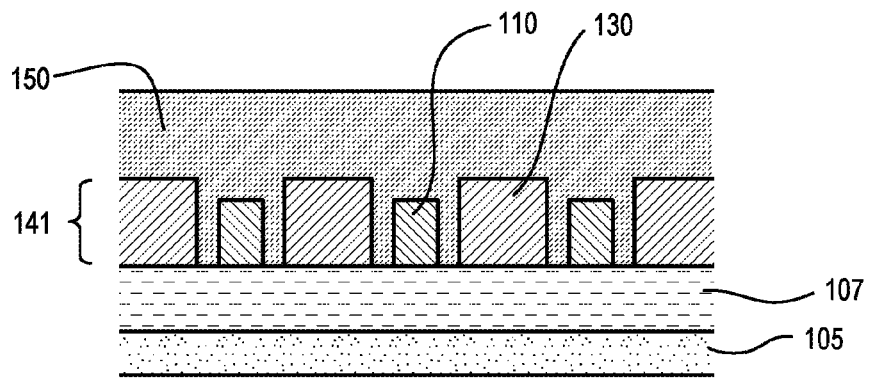

Referring now to FIG. 10, the method herein includes covering the first mask 141 with a layer of radiation-sensitive material 150. In some embodiments, the radiation-sensitive material can be a negative tone developer photoresist. An exposure pattern in the layer of radiation-sensitive material 150 can be developed. This exposure pattern can be exposed via photolithography. Developing the exposure pattern results in a second mask 152 as a layer uncovering portions of the first mask 141. The first mask 141 and the second mask 152 together defining a combined pattern 155. Note that because first mask 141 had been treated to prevent any additional solubility shifts, radiation-sensitive material 150 can be exposed and developed as a conventional photoresist.

Figure 12:
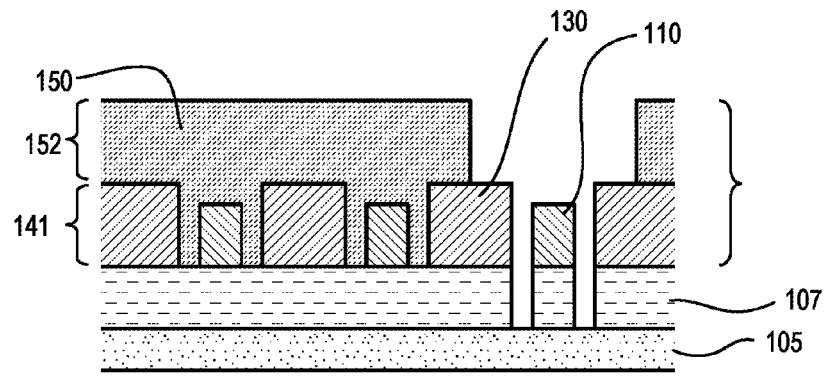
Figure 13:
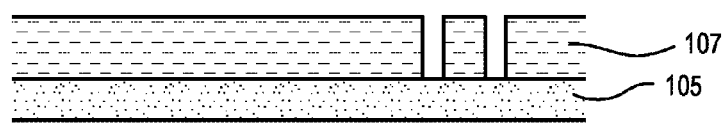

The combined pattern 155 can then be subsequently transferred into the substrate or target layer 107. An example result is shown in FIG. 12. After transferring this combined pattern, masking layers can be removed resulting in a target layer 107 having desired structures and/or openings. In one example application, the exposure pattern defines locations of contacts on the substrate, so that transferring the combined pattern includes transferring slot-shaped contact openings into the substrate.

Figure 9:
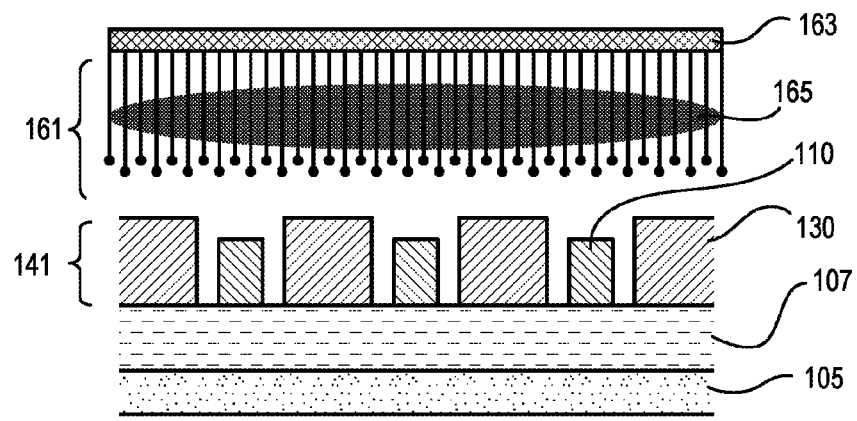
Figure 11:
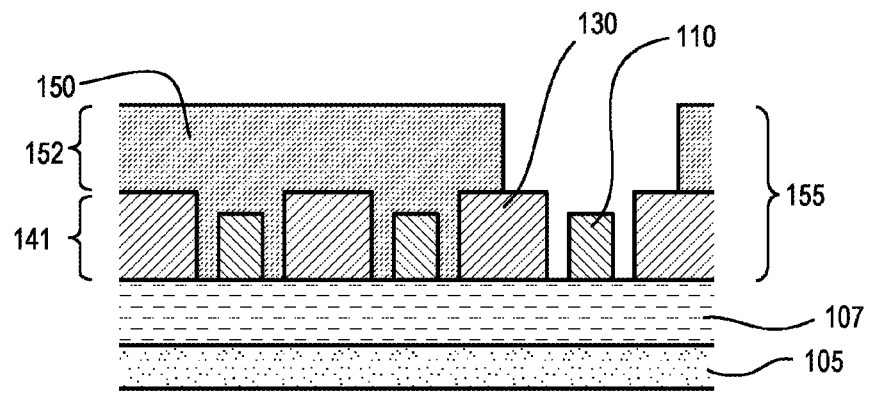
Figure 14:
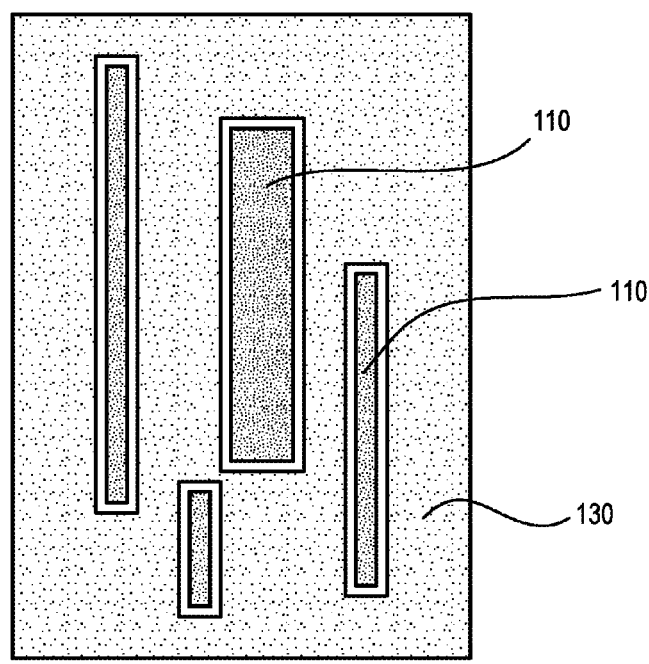
FIGS. 14-16 are schematic, top views of a substrate segment showing a process sequence for patterning a substrate.
Figure 15:
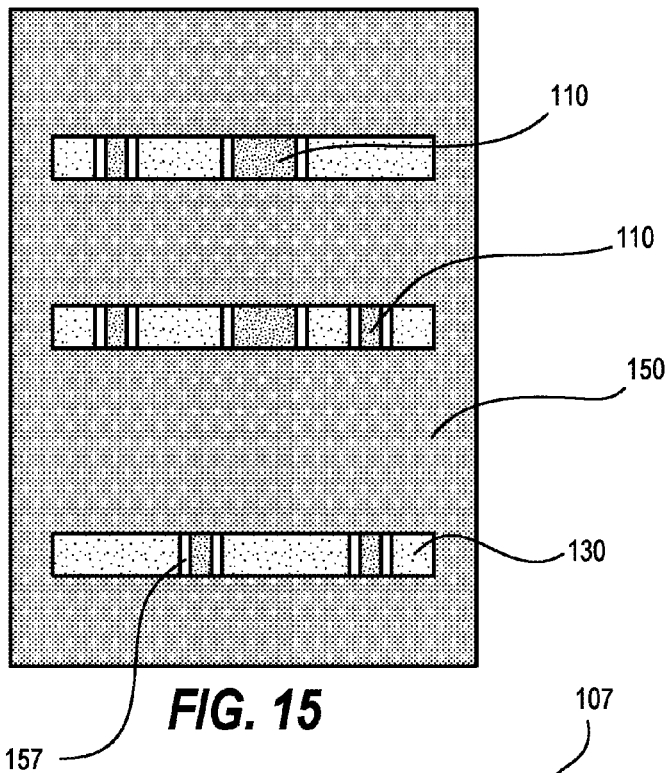
Figure 16:
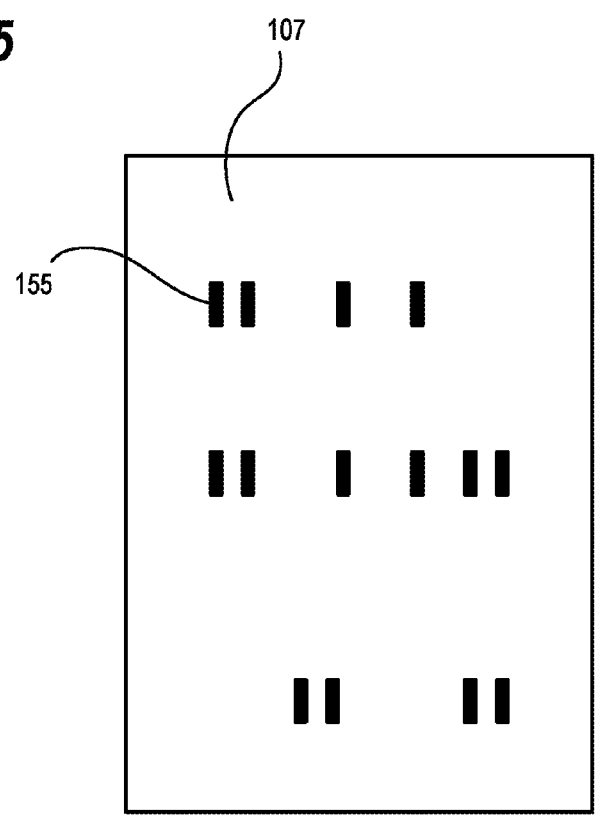

FIG. 14 is a top-down schematic view of an example substrate that includes mandrels 110, filler material 130, with sacrificial structures having been removed from an interface between the mandrels 110 and the filler material 130. FIG. 14 can be comparable to a top view of the substrate segment shown in FIG. 9, after the resist has been hardened. FIG. 15 shows a top view comparable to FIG. 11 in which radiation-sensitive material 150 has been deposited on the substrate, patterned via photolithography, and then developed to uncover the underlying first mask. This combined mask now defines several openings 157, which can be transferred into target layer 107, such as by using an anisotropic etch process, with the resulting target layer 107 being patterned with several openings 157 such as for slot contacts as shown in FIG. 16.

Figure 17:
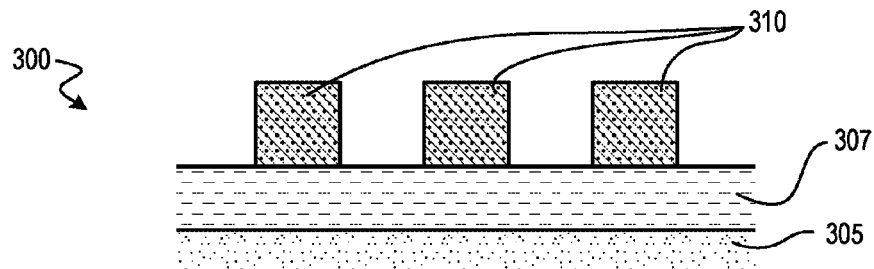
FIGS. 17-24 are schematic, cross-sectional views of a substrate segment showing a process sequence for patterning a substrate.

FIGS. 17-24 show an alternative process sequence. Features and steps that are similar to FIGS. 1-13 have similar numbering. Referring now to FIG. 17, substrate 300 includes target layer 307, one or more underlying layers 305, and mandrels 310 positioned on target layer 307. Note that mandrels 310 are comprised of mandrel material as well as a chemically active species. For example, a photo acid generator (PAG) or thermal acid generator (TAG) can be embedded in the mandrel material. A particular PAG can respond to a particular light wavelength or temperature that is different than other radiation-sensitive species within the mandrel material. In other words, the chemically active species is already inside the mandrels 310.

Figure 18:
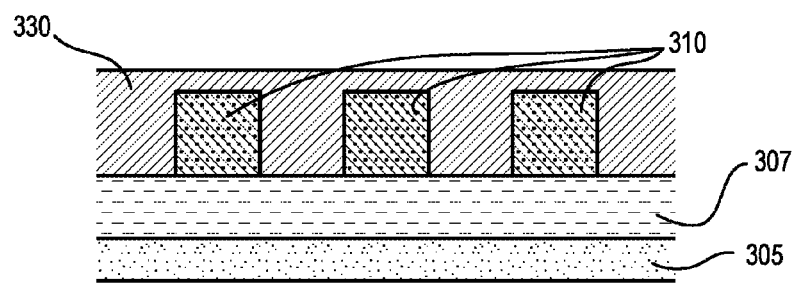

In FIG. 18 a filler material 330 is then deposited on substrate 300 such as by spin-on deposition. The filler material 330 fills spaces between mandrels 310, and typically covers or partially covers the mandrels 310.

Figure 19:
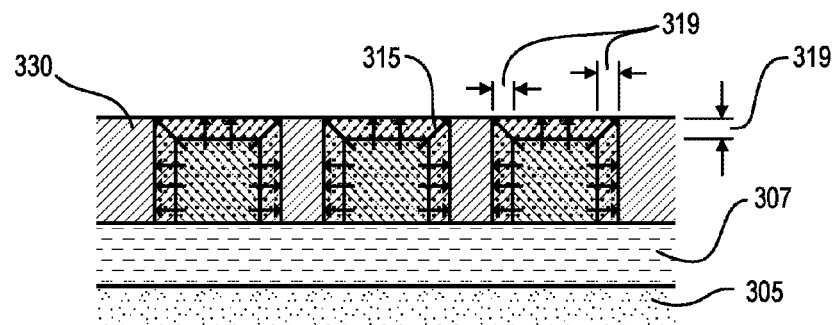
Figure 20:
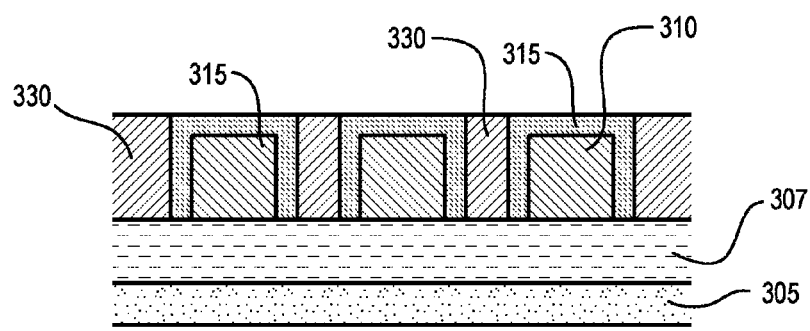

In FIG. 19 sacrificial structures 315 are formed. Note that in this process sequence, sacrificial structures 315 are formed using filler material 330. Thus, forming the sacrificial structures comprises chemically altering portions of the filler material at interfaces with the mandrel material. Chemically altering portions of the filler material can include changing a solubility of portions of the filler material. Such a solubility shift can be achieved by causing chemically active species contained within the mandrel material to diffuse into the filler material at interfaces between the mandrel material and the filler material. Activation of the chemically active species can include heating the substrate 300 such that acid diffuses from the mandrel material into the filler material so that the sacrificial structures are comprised of the filler material. Dimensions 319 illustrate example diffusion distances. FIG. 20 shows a result of the substrate segment after this solubility shift. Note that filler material 330 has essentially shrunk at particular locations, and sacrificial structures 315 are now created. In some embodiments, because the chemically active species is already in the mandrel material, a particular diffusion length can extend from a top of a given mandrel to the top of the filler material 330. The advantage of this result is that a top-down diffusion step or topcoat removal step is not needed because the now soluble sacrificial structures are exposed on a surface of the substrate 300 and thus can be dissolved and removed.

Figure 21:
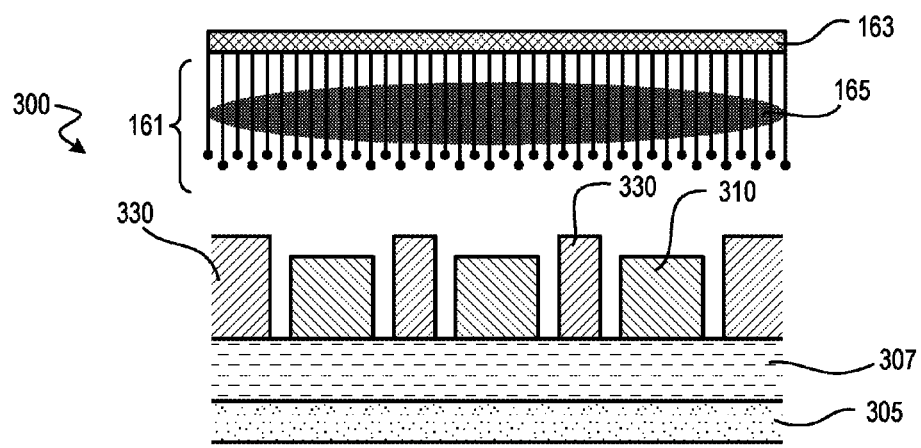
Figure 22:
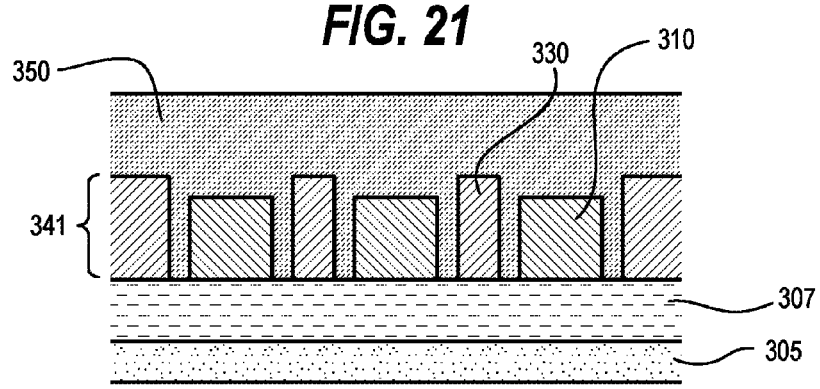
Figure 23:
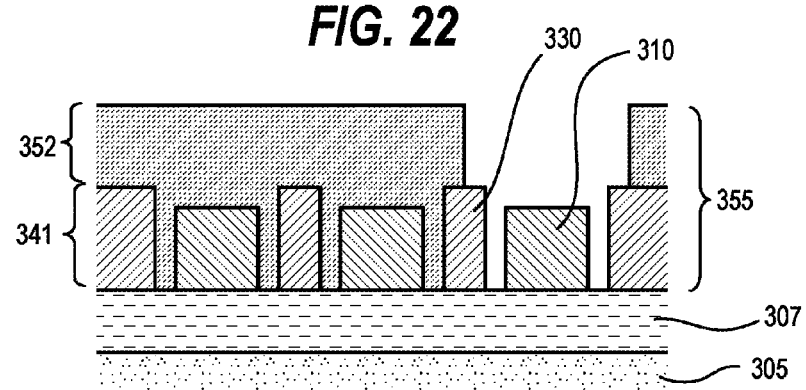
Figure 24:
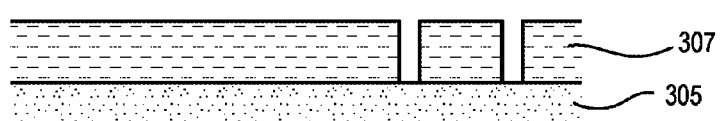

The remaining FIGS. 21-24) follow the process sequence explained for FIGS. 9-13, that is, mandrel material and filler material are treated with ballistic electrons to cross-link and/or harden such material so that the materials are no longer soluble or photo reactive (FIG. 21). A subsequent patterning sequence using radiation-sensitive material can be executed to create a combined pattern which can result in sub-resolution features. FIG. 22 shows radiation-sensitive material 350 coated over first mask 341, which can then receive a pattern of actinic radiation to shift solubility of a portion of radiation-sensitive material 350. Developing the exposure pattern results in a second mask 352 layer uncovering portions of the first mask 341. FIG. 23 illustrates combined pattern 355 after a portion of radiation-sensitive material 350 has been removed. FIG. 24 then shows a result of etch transfer of combined pattern 355 and removal of the masking layers.

Techniques as described herein can provide several advantages. One advantage is that anti-spacers made of photoresist can be crossed with a photoresist. Conventionally, crossing a photoresist with a photoresist will destroy any underlying pattern. With techniques herein, however, crossing two photoresist materials/layers can be executed to create patterns. As such, cut masks and contact openings can be made on pitch. In addition to providing precisely controllable CDs, techniques herein can also enable desirable pitch designs, such as in conjunction with EUV. For example, conventional immersion tools can provide a pitch as small as 40 nm, but not smaller. An EUV tool can provide a pitch of 32 nm, which can be doubled to a 16 nm pitch, whereas doubling of patterns from immersion photolithography tools only reaches 21 nm. Thus, anti-spacers herein can be cross-linked, hardened ("frozen") and then crossed with photolithography patterns from EUV tools, immersion tools, or other exposure tools.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for forming a pattern on a substrate, the method comprising:
    forming mandrels comprising mandrel material on a target layer of a substrate, the mandrels defining spaces between adjacent mandrels;
    depositing a filler material into the defined spaces;
    forming sacrificial structures along an interface between the mandrels and the filler material;
    removing the sacrificial structures resulting in a first mask, the first mask including mask features comprising both the mandrel material and the filler material;
    treating the mask features with a flux of electrons by coupling negative polarity direct current power to a top electrode of a plasma processing system, wherein the top electrode comprises silicon, the flux of electrons being accelerated from the top electrode with sufficient energy to pass through a plasma and strike the mask features, wherein coupling negative polarity direct current power causes sputtering of silicon onto the first mask creating a conformal layer of silicon on the first mask;
    exposing the conformal layer of silicon to an oxygen-containing environment such that the conformal layer of silicon becomes silicon oxide;
    covering the first mask with a layer of radiation-sensitive material; and
    developing an exposure pattern in the layer of radiation-sensitive material, the exposure pattern having been created via photolithography, wherein developing the exposure pattern results in a second mask that uncovers portions of the first mask, the first mask and the second mask together defining a combined pattern.

2. The method of claim 1, further comprising:
    subsequently transferring the combined pattern into the target layer of the substrate.

3. The method of claim 1, wherein treating the mask features increases a resistance to developer chemicals.

4. The method of claim 1, wherein forming the sacrificial structures comprises chemically altering portions of the mandrel material at interfaces with the filler material; and wherein removing the sacrificial structures comprises removing chemically altered portions.

5. The method of claim 4, wherein chemically altering portions of the mandrel material include changing a solubility of portions of the mandrel material such that the sacrificial structures are comprised of mandrel material with changed solubility.

6. The method of claim 4, wherein chemically altering portions of the mandrel material includes diffusing a chemically active species into the portions of the mandrel material.

7. The method of claim 6, wherein forming the sacrificial structures includes depositing the chemically active species on the mandrels after forming the mandrels and prior to depositing the filler material; and subjecting the substrate to a bake process that activates diffusion of the chemically active species into the portions of the mandrel material.

8. The method of claim 1, wherein forming the sacrificial structures comprises chemically altering portions of the filler material at interfaces with the mandrel material; and wherein removing the sacrificial structures comprises removing chemically altered portions of the filler material.

9. The method of claim 8, wherein chemically altering portions of the sacrificial structures includes changing a solubility of portions of the sacrificial structures.

10. The method of claim 8, wherein chemically altering portions includes diffusing a chemically active species into the portions.

11. The method of claim 8, wherein chemically altering portions of the sacrificial structures includes heating the substrate such that acid diffuses from the mandrel material into the filler material so that the sacrificial structures are comprised of filler material.

12. The method of claim 1, wherein removing the sacrificial structures includes executing a developer cleaning process that dissolves chemically altered portions using a developer and clears dissolved material from the substrate, the chemically altered portions being more soluble to a developer as compared to unaltered portions of the mandrels.

13. The method of claim 1, wherein the filler material covers the mandrels, and wherein removing the sacrificial structures includes executing a top-down acid diffusion process that changes a solubility of a top portion of the filler material from a top surface of the filler material to a top surface of the sacrificial structures.

14. The method of claim 13, further comprising removing the top portion of the filler material such that the sacrificial structures are uncovered.

15. The method of claim 13, further comprising removing the top portion of the filler material and removing the sacrificial structures using a developer.

16. The method of claim 1, wherein the exposure pattern defines locations of transistor contacts on the substrate; and wherein transferring the combined pattern includes transferring slot-shaped contact openings into the substrate.

17. The method of claim 1, wherein the mandrel material is a second radiation-sensitive material, and wherein the filler material is a third radiation-sensitive material.

18. The method of claim 17, wherein mandrels have been formed by developing a latent pattern in the second radiation-sensitive material, the latent pattern formed by photolithographic exposure.

* * * * *